(12) United States Patent
Chang et al.

(10) Patent No.: US 12,047,070 B2
(45) Date of Patent: Jul. 23, 2024

(54) MAIN BOARD, HOT PLUG CONTROL SIGNAL GENERATOR, AND CONTROL SIGNAL GENERATING METHOD THEREOF

(71) Applicant: Wiwynn Corporation, New Taipei (TW)

(72) Inventors: Wei-Fang Chang, New Taipei (TW);
Yu-Chun Chen, New Taipei (TW);
Nan-Huan Lin, New Taipei (TW);
Chung-Hui Yen, New Taipei (TW);
Shi-Rui Chen, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 121 days.

(21) Appl. No.: 17/849,733

(22) Filed: Jun. 27, 2022

(65) Prior Publication Data

US 2023/0327673 A1 Oct. 12, 2023

(30) Foreign Application Priority Data

Apr. 7, 2022 (TW) .................................. 111113219

(51) Int. Cl.
*G06F 13/40* (2006.01)
*H03K 19/017* (2006.01)
*H03K 19/17736* (2020.01)
*H03K 19/1776* (2020.01)
*H03K 19/17784* (2020.01)
*H03K 19/20* (2006.01)

(52) U.S. Cl.
CPC ...... *H03K 19/1776* (2013.01); *G06F 13/4081* (2013.01); *H03K 19/01742* (2013.01); *H03K 19/1774* (2013.01); *H03K 19/17784* (2013.01); *H03K 19/20* (2013.01)

(58) Field of Classification Search
CPC .......... G06F 13/4081; H03K 19/01742; H03K 19/1774; H03K 19/1776; H03K 19/17784; H03K 19/20
See application file for complete search history.

(56) References Cited

U.S. PATENT DOCUMENTS

| 2004/0057182 A1* | 3/2004 | Yuan | G06F 13/4081 361/100 |
| 2016/0328350 A1* | 11/2016 | Yang | G06F 13/4027 |
| 2021/0041930 A1* | 2/2021 | Simonson | G06F 1/28 |

FOREIGN PATENT DOCUMENTS

TW 472185 1/2002

* cited by examiner

*Primary Examiner* — Kurtis R Bahr
(74) *Attorney, Agent, or Firm* — JCIPRNET

(57) ABSTRACT

A main board, a hot plug control signal generator, and a control signal generating method thereof are provided. The hot plug control signal generator includes a controller and a latch. The controller provides a control signal. The latch is operated based on an operation power to generate a hot plug control signal. The latch sets the hot plug control signal to a disabled first logic value, and latches the hot plug control signal at the first logic value.

14 Claims, 6 Drawing Sheets

MAIN BOARD, HOT PLUG CONTROL SIGNAL GENERATOR, AND CONTROL SIGNAL GENERATING METHOD THEREOF

CROSS-REFERENCE TO RELATED APPLICATION

This application claims the priority benefit of Taiwan application serial no. 111113219, filed on Apr. 7, 2022. The entirety of the above-mentioned patent application is hereby incorporated by reference herein and made a part of this specification.

BACKGROUND

Technical Field

The disclosure relates to a main board, a hot plug control signal generator, and a control signal generating method thereof, and in particular to a hot plug control signal generator that can ensure the safety of a main board and a control signal generating method thereof.

Description of Related Art

In the current technical field, a power switch in a main board may be controlled through setting a hot swap controller. When an abnormal phenomenon occurs in the main board, the hot swap controller may disconnect the power switch to prevent power from entering the main board. However, in a conventional computer system, after a tray of a server is re-plugged, the server will supply power to the main board again. Therefore, it is possible to cause more serious damage to the main board before engineers can complete effective analysis and troubleshooting.

SUMMARY

The disclosure provides a main board, a hot plug control signal generator, and a control signal generating method thereof, which can latch a hot plug control signal generated by an abnormal phenomenon to ensure the safety of the main board.

The hot plug control signal generator of the disclosure includes a controller and a latch. The controller provides a control signal. The latch is coupled to the controller. The latch is operated based on an operation power to generate a hot plug control signal. The latch sets the hot plug control signal to a disabled first logic value according to the control signal, and latches the hot plug control signal at the first logic value.

The main board of the disclosure includes a hot swap controller and a hot plug control signal generator. The hot plug control signal generator includes a controller and a latch. The controller provides a control signal. The latch is coupled to the controller. The latch is operated based on an operation power to generate a hot plug control signal. The latch sets the hot plug control signal to a disabled first logic value according to the control signal, and latches the hot plug control signal at the first logic value.

The generating method of a hot plug control signal of the disclosure includes the following steps. A control signal is provided by a controller. A latch is operated based on an operation power to generate a hot plug control signal. The hot plug control signal is set to a disabled first logic value according to the control signal by the latch. The hot plug control signal is latched at the first logic value.

Based on the above, the hot plug control signal generator of the disclosure can enable the hot swap controller to continuously disconnect the supply of power according to the latched hot plug control signal through the hot plug control signal generated by the latch when an abnormal phenomenon occurs in the main board. In this way, before the fault is determined to be eliminated, the main board will not be damaged again due to the negligence of manual work, which effectively ensures the safety of the main board.

DETAILED DESCRIPTION OF DISCLOSED EMBODIMENTS

Figure 1:
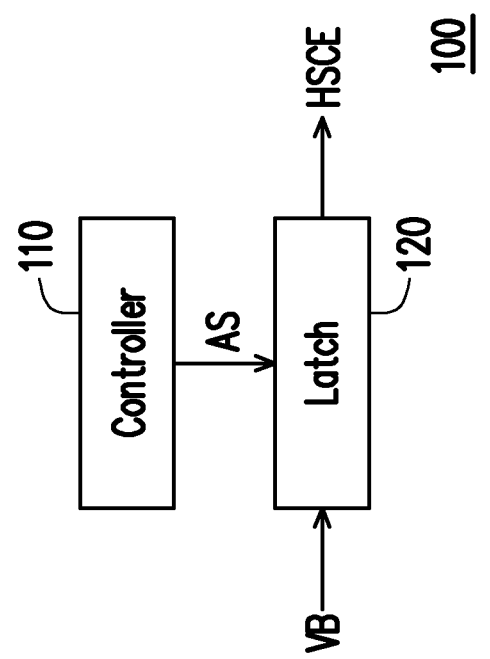
FIG. 1 is a schematic diagram of a hot plug control signal generator according to an embodiment of the disclosure.

Please refer to FIG. 1, which is a schematic diagram of a hot plug control signal generator according to an embodiment of the disclosure. A hot plug control signal generator 100 includes a controller 110 and a latch 120. The controller 110 is coupled to the latch 120 and is configured to provide a control signal AS to the latch 120. The latch 120 receives an operation power VB. The latch 120 is operated based on the operation power VB, and generates a hot plug control signal HSCE according to the control signal AS.

In the embodiment, the controller 110 and the latch 120 may be both disposed on a main board. Moreover, when an abnormal phenomenon occurs in the main board, the controller 110 may generate the control signal AS corresponding to the abnormal phenomenon in the main board. Correspondingly, when the latch 120 receives the control signal AS indicating that an abnormal phenomenon occurs in the main board, the generated hot plug control signal HSCE may be set to a disabled first logic value, and the hot plug control signal HSCE may be latched at the first logic value, wherein the first logic value may be logic value 0 or 1, and is not limited thereto.

An abnormal phenomenon of the main board may be an over temperature (OT) and/or an over current (OC) phenomenon that occurs in the main board.

In the embodiment, the hot plug control signal HSCE may be sent to a hot swap controller on the main board. When the hot plug control signal HSCE is latched at the disabled first logic value, the hot swap controller may correspondingly generate a gate signal, so that a power switch in the main board is disconnected, and stops power supplied, for example, by a rack power supply from being input into the main board, so as to maintain the safety of the main board. Based on a latch state of the hot plug control signal HSCE, the power switch in the main board can be disconnect continuously, so that the main board will not be damaged again due to human malfunction.

It is worth mentioning that the operation power VB received by the latch 120 of the disclosure is independent of a rack power received by the power switch. Therefore, when the power switch is disconnected, the latch 120 may still maintain operation and maintain the latch state of the hot plug control signal HSCE. In the embodiment, the operation power VB may be provided by a battery or by an external power.

It should be noted that in the embodiment, the latch state of the hot plug control signal HSCE must be released through a specific mechanism. An engineer can activate the specific mechanism only after determining the completion of troubleshooting, which can ensure the safety of the main board.

Figure 2:
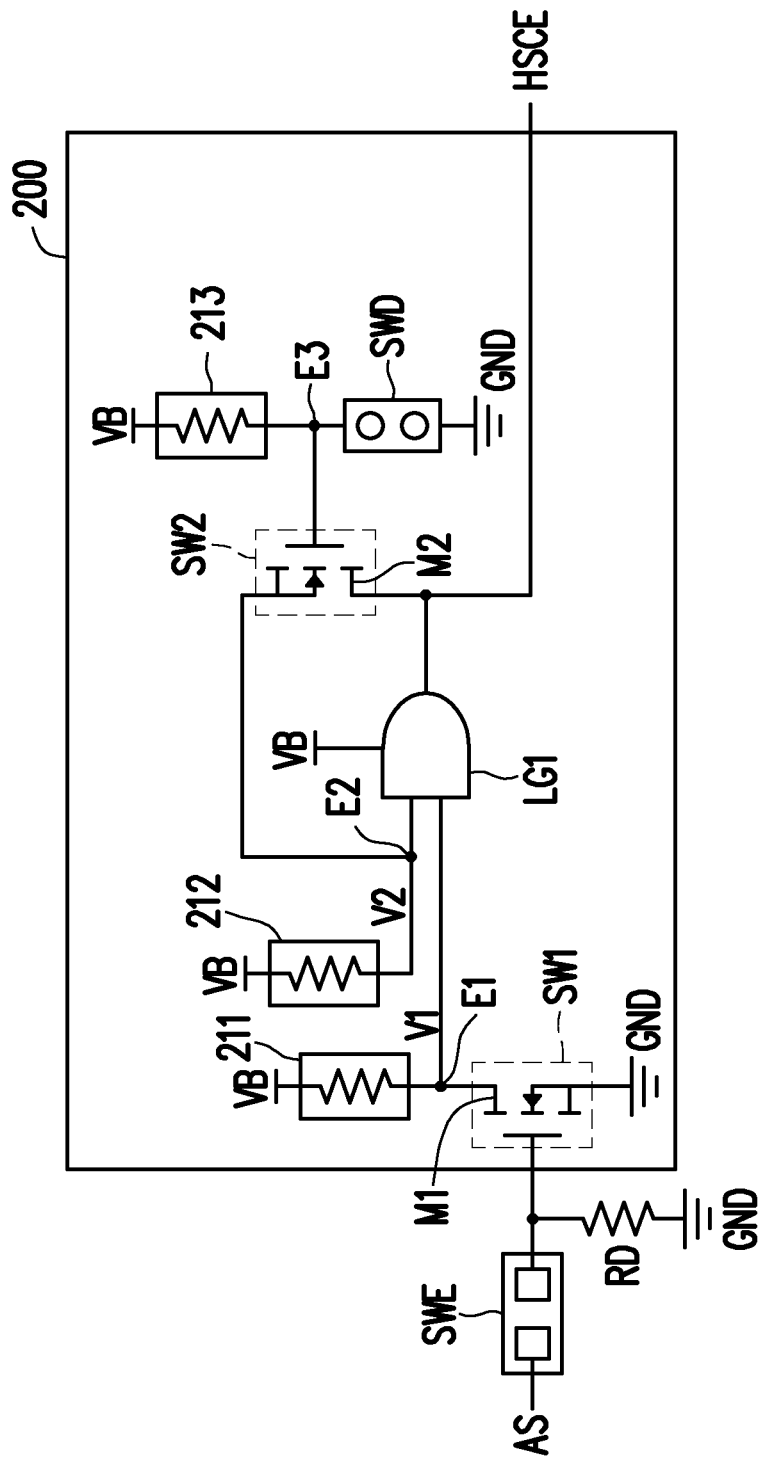
FIG. 2 is a schematic diagram of an implementation of a latch of a hot plug control signal generator according to an embodiment of the disclosure.

Please refer to FIG. 2, which is a schematic diagram of an implementation of a latch of a hot plug control signal generator according to an embodiment of the disclosure. A latch 200 may receive a control signal AS through an external switch SWE. During the protection of a main board, the external switch SWE may be in a conducted state. Furthermore, when the external switch SWE is disconnected, a resistor RD may pull down a voltage of a control end of a switch SW1 to a reference ground voltage.

The latch 200 includes pull-up circuits 211 to 213, switches SW1 and SW2, and a logic gate LG1. The pull-up circuits 211 to 213 receive an operation power VB and are respectively coupled to a first end E1, a second end E2, and a third end E3. The pull-up circuits 211 to 213 are configured to pull up voltages on the first end E1, the second end E2, and the third end E3 to the operation power VB. The switch SW1 is coupled between the first end E1 and a reference ground end GND, and is conducted or disconnected according to the control signal AS.

An input end of the logic gate LG1 is coupled to the first end E1 and the second end E2, and respectively receives voltages V1 and V2 on the first end E1 and the second end E2. The logic gate LG1 is configured to perform logic operations on the voltages V1 and V2 on the first end E1 and the second end E2, so as to generate a hot plug control signal HSCE. In the embodiment, the logic gate LG1 is an AND gate, and the logic operation is a logic AND operation. In the embodiment, the logic gate LG1 is operated based on the operation power VB.

The switch SW2 is coupled between an output end of the logic gate LG1 and the second end E2. A control end of the switch SW2 is coupled to the third end E3.

The hot plug control signal generator of the embodiment also includes a latch release device SWD. The latch release device SWD may be a switch element and is coupled between the third end E3 and the reference ground end GND.

Incidentally, in the embodiment, the switches SW1 and SW2 may be implemented by transistors, and the pull-up circuits 211 to 213 may be implemented by resistors.

In terms of action details, under the condition that the external switch SWE is conducted, when the main board is in a normal state, the control signal AS may be logic value 0, and the switch SW1 may be disconnected, so that the voltage V1 on the first end E1 may be pulled up to the operation power VB by the pull-up circuit 211 and is rendered as logic value 1. In addition, the voltage V2 on the second end E1 is pulled up to the operation power VB by the pull-up circuit 212 and is rendered as logic value 1. In this way, the logic gate LG1 may generate the hot plug control signal HSCE, which is also logic value 1, according to the voltages V1 and V2, which are both logic value 1, so that the main board can operate normally.

Incidentally, a voltage on the third end E3 may be pulled up to the operation power VB by the pull-up circuit 213 and is rendered as logic value 1. Therefore, the switch SW2 may be conducted. The logic gate LG1 and the switch SW2 form a latch circuit.

In addition, under the same condition that the external switch SWE is conducted, when an abnormal phenomenon occurs in the main board, the control signal AS may be logic value 1, and the switch SW1 may be conducted, so that the voltage V1 on the first end E1 may be pulled down and is rendered as logic value 0. At the same time, the output end of the logic gate LG1 may generate the hot plug control signal HSCE with logic value 0. Here, the hot plug control signal HSCE with logic value 0 may enable a hot swap controller on the main board to disconnect a power switch, and stop a power supplied by a rack power supply from being input into the main board, which can ensure the safety of the main board.

The point is that through the conducted switch SW2, the voltage V2 on the second end E2 may be pulled down to logic value 0 by the output end of the logic gate LG1. The logic gate LG1 and the switch SW2 form a latch circuit, so that the hot plug control signal HSCE is latched at disabled logic value 0.

In the embodiment, a latch state of the hot plug control signal HSCE may be released through conducting the latch release device SWD. Alternatively, the latch state of the hot plug control signal HSCE may also be released by restarting the operation power VB. In other words, an engineer may conduct the latch release device SWD or restart the operation power VB after determining that faults of the main board are all eliminated to release the latch state of the hot plug control signal HSCE and restore the operation of the main board.

Figure 3:
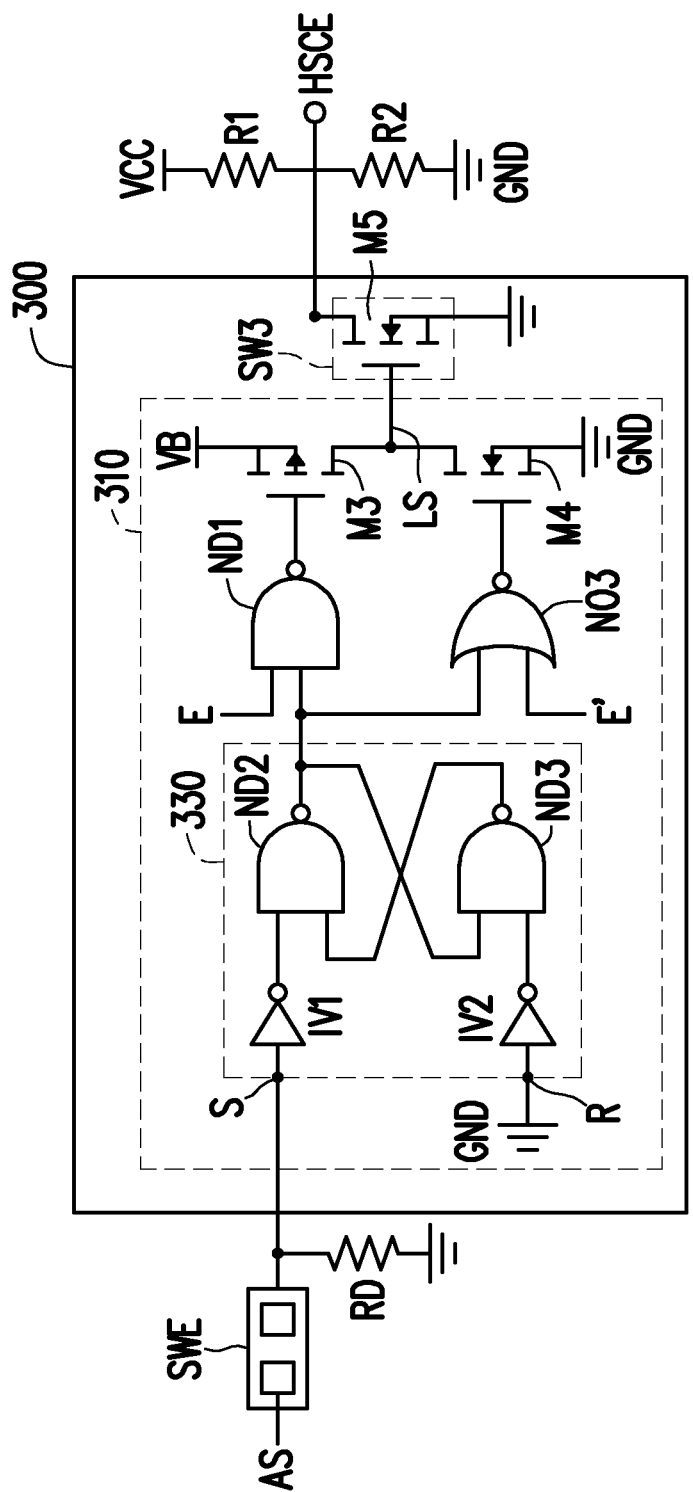
FIG. 3 is a schematic diagram of another implementation of a latch of a hot plug control signal generator according to an embodiment of the disclosure.

Please refer to FIG. 3, which is a schematic diagram of another implementation of a latch of a hot plug control signal generator according to an embodiment of the disclosure. A latch 300 may receive a control signal AS through an external switch SWE. During the protection of a main board, the external switch SWE may be in a conducted state. Furthermore, when the external switch SWE is disconnected, a resistor RD may pull down a voltage of a control end of a switch SW1 to a reference ground voltage.

The latch 300 includes a reset-set (RS) flip-flop 310 and a pull-down switch SW3. The reset-set flip-flop 310 includes a reset-set (RS) latch circuit 330, NAND gates ND1 to ND3, a NOR gate NO3, inverters IV1 and IV2, and transistors M3 and M4. The reset-set latch circuit 330 is constituted by the NAND gates ND2 and ND3. A set end S of the reset-set latch circuit 330 is configured to receive a reverse signal of the control signal AS through the inverter IV1, and a reset end R of the reset-set latch circuit 330 is coupled to a reference ground end GND through the inverter IV2.

The NAND gate ND1 and the NOR gate NO3 are both coupled to an output end of the reset-set latch circuit 330, and the other input end of the NAND gate ND1 receives a signal E, wherein the signal E may be logic value 1. The other input end of the NOR gate NO3 receives a signal E', wherein the signal E' may be logic value 0. The transistors M3 and M4 are coupled in series between an operation power VB and the reference ground end GND. Control ends of the transistors M3 and M4 are respectively coupled to output ends of the NAND gate ND1 and the NOR gate NO3. The transistors M3 and M4 are configured to generate a latch signal LS.

The pull-down switch SW3 decides whether to pull down a hot plug control signal HSCE according to the latch signal LS. When the pull-down switch SW3 is conducted, the hot plug control signal HSCE may be pulled down to logic value 0. On the contrary, when the pull-down switch SW3 is disconnected, the hot plug control signal HSCE may be in a state of logic value 1 according to a voltage division performed by resistors R1 and R2 for a power VCC.

In the embodiment, the pull-down switch SW3 may be constructed by a transistor M5.

In terms of action details, under the condition that the external switch SWE is conducted, when the main board is in a normal state, the control signal AS may be logic value 0. At this time, voltages on the set end S and the reset end R of the reset-set latch circuit 330 are both in a state of logic value 0. At this time, the latch signal LS generated by the reset-set flip-flop 310 may be equal to an initial value and is logic value 0. Correspondingly, the pull-down switch SW3 is disconnected, and the hot plug control signal HSCE may be maintained in a state of logic value 1, so that the main board can operate normally.

In addition, under the same condition that the external switch SWE is conducted, when an abnormal phenomenon occurs in the main board, the control signal AS may be logic value 1. At this time, the reset-set latch circuit 330 may set an output signal generated by the NOR gate NO1 to logic value 1 according to a voltage with logic value 1 on the set end S. Also, based on the output signal and the signal E of the NOR gate NO1, the NAND gate ND1 may generate an output signal with logic value 0, so that the transistor M3 is conducted. Correspondingly, the NOR gate NO3 may generate an output signal with logic value 0 according to the output signal (with logic value 1) generated by the NOR gate NO1 and the signal E' with logic value 0, so that the transistor M4 is disconnected.

Based on the transistor M3 being conducted (the transistor M4 being disconnected), the latch signal LS may be equal to the operation power VB and is logic value 1. The pull-down switch SW3 may be conducted, so that the hot plug control signal HSCE is equal to logic value 0. Here, the hot plug control signal HSCE with logic value 0 may enable a hot swap controller on the main board to disconnect a power switch, and stop a power supplied by a rack power supply from being input into the main board, which can ensure the safety of the main board.

Note here that the reset end R of the reset-set latch circuit 330 is coupled to the reference ground end GND. Therefore, the hot plug control signal HSCE may be latched in a state equal to logic value 0, which can effectively maintain the safety of the main board.

After an engineer has effectively eliminated the abnormal phenomenon of the main board, a latch state of the hot plug control signal HSCE may be released through restarting the operation power VB, so that the main board can resume normal operation.

Figure 4:
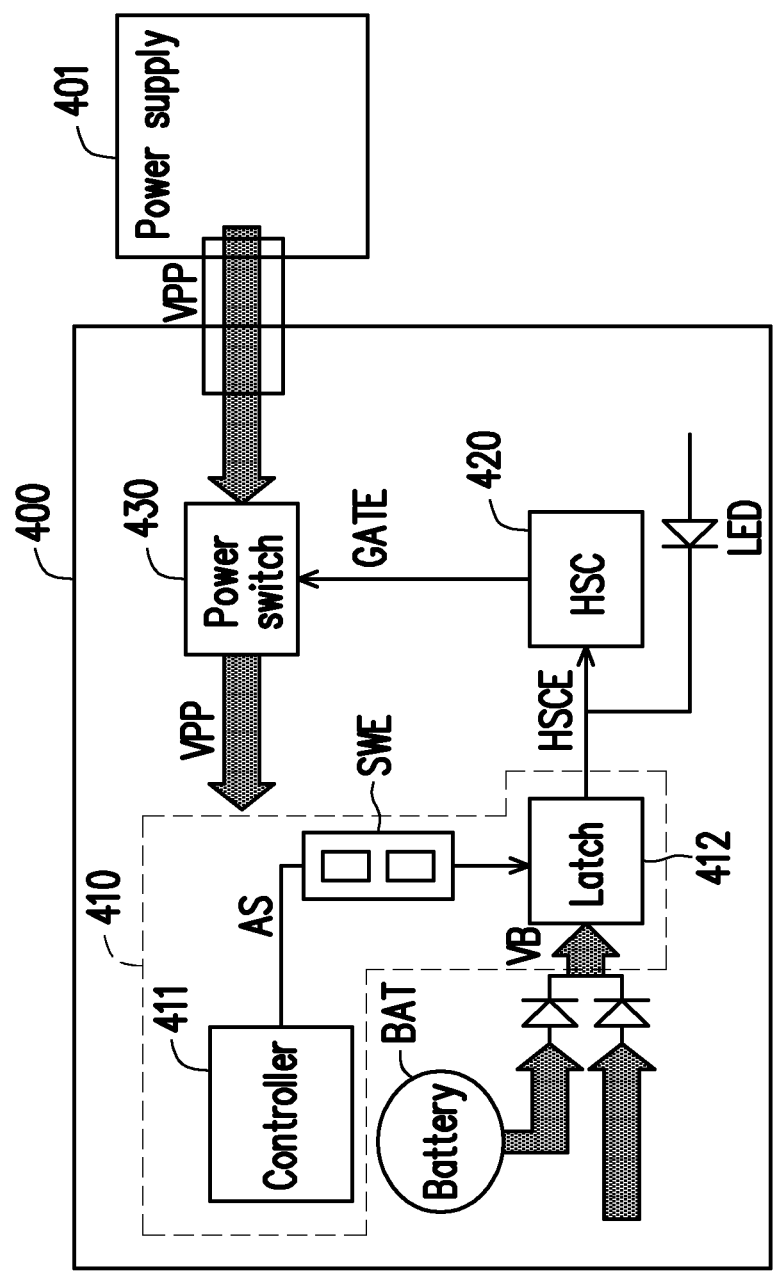
FIG. 4 is a schematic diagram of a main board according to an embodiment of the disclosure.

Please refer to FIG. 4, which is a schematic diagram of a main board according to an embodiment of the disclosure. A main board 400 includes a hot plug control signal generator 410, a hot swap controller 420 and a power switch 430. The hot plug control signal generator 410 is coupled to the hot swap controller 420. The hot plug control signal generator 410 includes a controller 411 and a latch 412. The controller 411 may be coupled to the latch 412 through a switch SWE. When an abnormal phenomenon protection mechanism of the main board 400 is executed, the external switch SWE is in a conducted state. Action details of the hot plug control signal generator 410 have been described in detail in the foregoing embodiments and implementations, and will not be described in detail below. In other embodiments of the disclosure, the main board 400 further includes a processor and a chip set coupled to the controller 420, and electronic elements such as a solid state drive and a memory coupled to the processor.

It is worth mentioning that the latch 412 may receive an operation power VB through a battery BAT or receive the operation power VB through an external power.

In addition, in the embodiment, the hot swap controller 420 is coupled to the hot plug control signal generator 410 and the power switch 430. The hot swap controller 420 receives a hot plug control signal HSCE generated by the hot plug control signal generator 410, and generates a gate signal GATE according to the hot plug control signal HSCE. The hot swap controller 420 provides the gate signal GATE to a control end of the power switch 430 to control conducted and disconnected states of the power switch 430.

In detail, when the hot plug control signal HSCE is in an enabled state, the hot swap controller 420 may provide the gate signal GATE, so that the power switch 430 is conducted. On the contrary, when the hot plug control signal HSCE is in a disabled state, the hot swap controller 420 may provide the gate signal GATE, so that the power switch 430 is disconnected.

The power switch 430 is configured to be coupled to a power supply 401. The power supply 401 may be a rack power supply. Whether the power switch 430 is conducted is used to decide whether to transmit a power VPP generated by the power supply 401 to the inside of the main board 400. In the embodiment, when the main board 400 is in a normal state, the power switch 430 may be conducted and transmit the power VPP to the inside of the main board 400. On the contrary, when an abnormal phenomenon occurs in the main board 400, the power switch 430 may be disconnected to prevent the power VPP from being transmitted to the inside of the main board 400, so as to ensure the safety of the main board 400. In some embodiments of the disclosure, electronic elements such as the controller 411, a processor, a chip set, a solid state drive, and a memory on the main board 400 may be supplied with the operation power by the power supply 401, and the electronic elements may be independent of an operation power VB. In some embodiments of the disclosure, the operation power VB may be independent of the power supply 401.

Incidentally, the hot swap controller 420 and the latch 412 may be connected to a light emitting diode LED. A cathode of the light emitting diode LED may receive the hot plug control signal HSCE, and emit light when the hot plug control signal HSCE is logic value 0 to inform an engineer that an abnormal phenomenon occurs in the main board 400.

In the embodiment of the disclosure, the controller 411 may be a power management chip, a current and/or temperature sensor, or a microprocessor chip with computing capability, and is not limited thereto.

Figure 5:
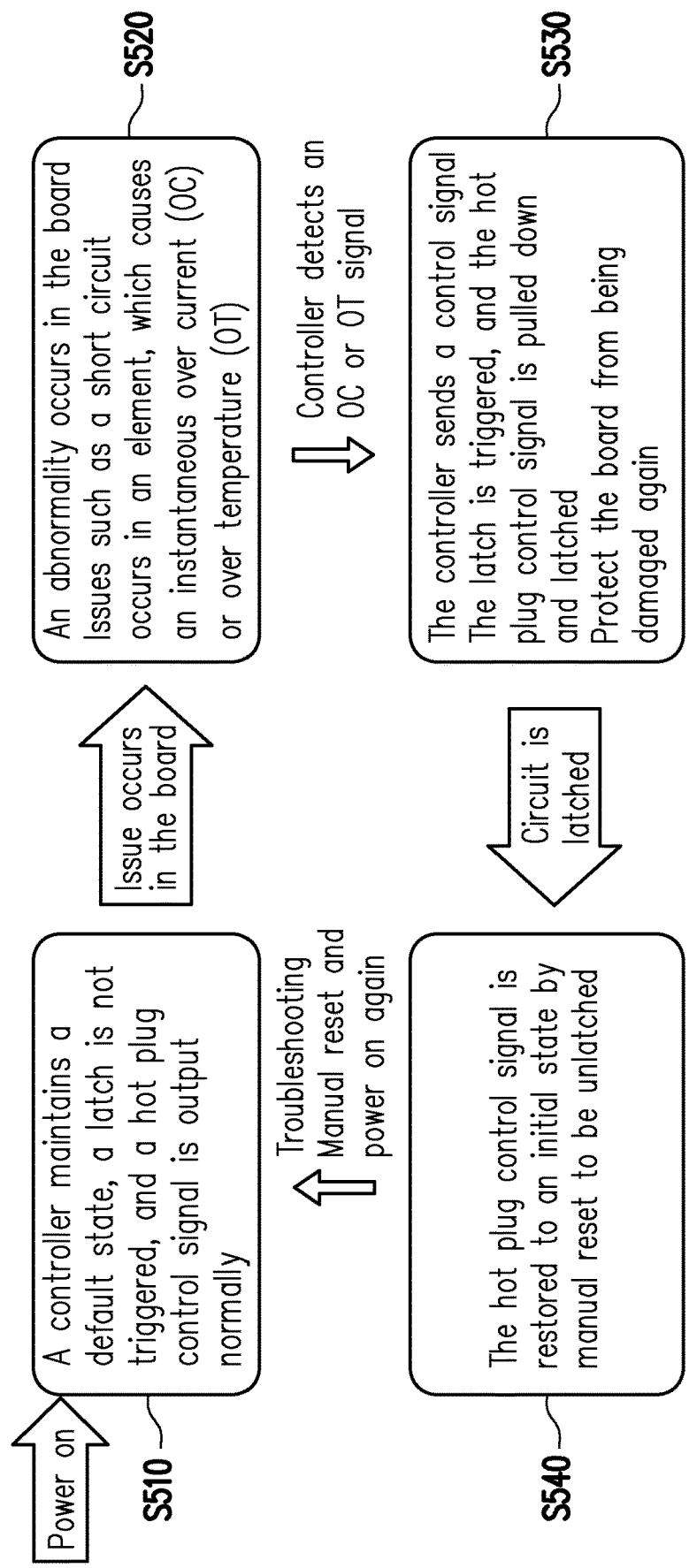
FIG. 5 is a flowchart of protection of a main board according to an embodiment of the disclosure.

Please refer to FIG. 5, which is a flowchart of protection of a main board according to an embodiment of the disclosure. In a state of a power of a main board being activated, in Step S510, the main board is in a normal state, a controller maintains a default state, a latch is not triggered, and a hot plug control signal is output normally (which is an enabled state). At this time, a hot swap controller may conduct a power switch in the main board, so that the main board can operate normally. Then, when an issue occurs in the board (main board), in Step S520, an abnormal phenomenon occurs in the main board. A short circuit phenomenon may occur in an element in the main board, which causes an over current (OC) and/or over temperature (OT) phenomenon.

Next, the controller may detect the OC and/or OT phenomenon, and in Step S530, the controller sends a corresponding control signal, so that the latch is triggered, and the hot plug control signal is pulled down and latched. In this way, the hot swap controller may disconnect the power switch in the main board to protect the main board from being damaged again.

Next, under the condition that the circuit is latched, in Step S540, the hot plug control signal may be restored to an initial state by manual reset to be in an unlatched state. Also, after the issue is effectively eliminated, through manual reset and power on again, the main board may return to Step S510 and resume normal operation.

Figure 6:
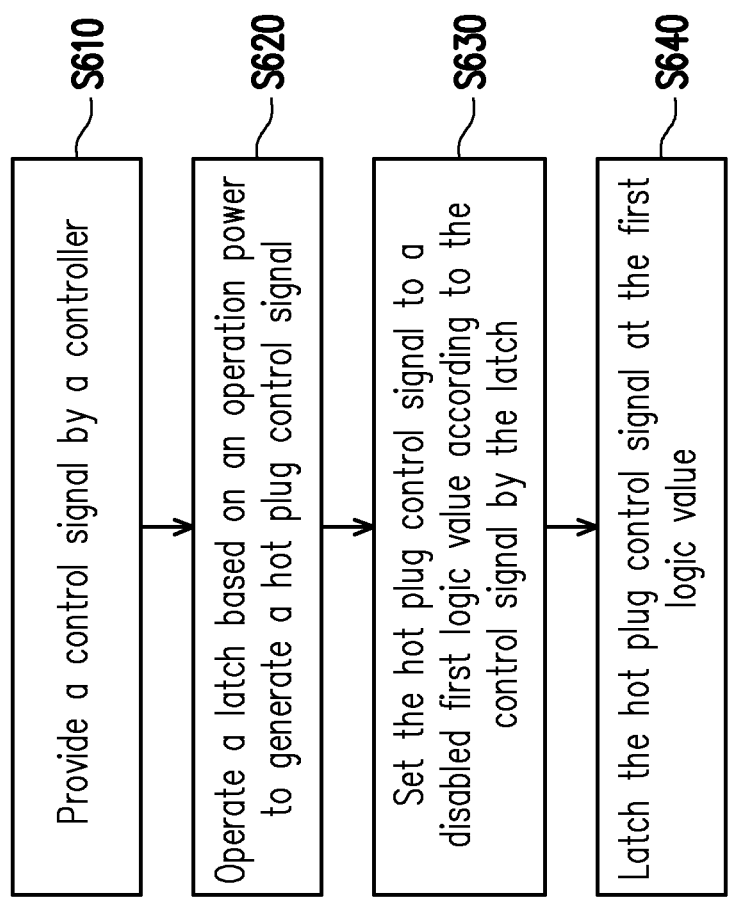
FIG. 6 is a flowchart of a generating method of a hot plug control signal according to an embodiment of the disclosure.

Please refer to FIG. 6, which is a flowchart of a generating method of a hot plug control signal according to an embodiment of the disclosure. In Step S610, a control signal is provided by a controller. In Step S620, a latch is operated based on an operation power to generate a hot plug control signal. In Step S630, the hot plug control signal is set to a disabled first logic value according to the control signal by the latch. In Step S640, the hot plug control signal is latched at the first logic value to effectively maintain the safety of a main board.

The implementation details of the above steps have been described in detail in the foregoing embodiments and implementations, and will not be repeated below.

In summary, in the disclosure, the control signal is generated through reflecting the abnormal phenomenon of the main board, and the hot plug control signal is set and latched in the disabled state according to the control signal. Through the hot plug control signal in the disabled state, the power switch in the main board may be disconnected to prevent the power from being transmitted to the inside of the main board, which can effectively protect the main board from being damaged again.

What is claimed is:

1. A hot plug control signal generator, comprising:
   a controller, providing a control signal; and
   a latch, coupled to the controller, wherein the latch is operated based on an operation power to generate a hot plug control signal,
   wherein the latch sets the hot plug control signal to a disabled first logic value according to the control signal, and latches the hot plug control signal at the first logic value,
   wherein the latch comprises:
   a plurality of pull-up circuits, respectively coupled to a first end, a second end, and a third end, and configured to pull up voltages on the first end, the second end, and the third end to the operation power;
   a first switch, coupled between the first end and a reference ground end, and conducted or disconnected according to the control signal;
   a logic gate, having two input ends respectively coupled to the first end and the second end, and performing a logic operation on voltages on the first end and the second end to generate the hot plug control signal; and
   a second switch, coupled between the first end and an output end of the logic gate, wherein a control end of the second switch is coupled to the third end and is conducted or disconnected according to a voltage on the third end.

2. The hot plug control signal generator according to claim 1, wherein the hot plug control signal generator is disposed on a main board, and when an abnormal phenomenon occurs in the main board, the controller provides the control signal, so that the latch latches the hot plug control signal at the first logic value.

3. The hot plug control signal generator according to claim 1, wherein the logic operation is a logic AND operation.

4. The hot plug control signal generator according to claim 1, further comprising:
   a latch release device, configured to short circuit the output end of the logic gate to the reference ground end and release a latch state of the hot plug control signal.

5. The hot plug control signal generator according to claim 1, wherein the latch receives the operation power through a battery or an external power.

6. A main board, comprising:
   a hot swap controller, receiving a hot plug control signal; and
   a hot plug control signal generator, coupled to the hot swap controller, the hot plug control signal generator comprising:
   a controller, providing a control signal; and
   a latch, coupled to the controller, wherein the latch is operated based on an operation power to generate the hot plug control signal,
   wherein the latch sets the hot plug control signal to a disabled first logic value according to the control signal, and latches the hot plug control signal at the first logic value,
   wherein the latch comprises:
   a plurality of pull-up circuits, respectively coupled to a first end, a second end, and a third end, and configured to pull up voltages on the first end, the second end, and the third end to the operation power;
   a first switch, coupled between the first end and a reference ground end, and conducted or disconnected according to the control signal;
   a logic gate, having two input ends respectively coupled to the first end and the second end, and performing a logic operation on voltages on the first end and the second end to generate the hot plug control signal; and
   a second switch, coupled between the first end and an output end of the logic gate, wherein a control end of the second switch is coupled to the third end and is conducted or disconnected according to a voltage on the third end.

7. The main board according to claim 6, wherein when an abnormal phenomenon occurs in the main board, the controller provides the control signal, so that the latch latches the hot plug control signal at the first logic value.

8. The main board according to claim 6, wherein the logic operation is a logic AND operation.

9. The main board according to claim 6, wherein the hot plug control signal generator further comprises:
   a latch release device, configured to short circuit the output end of the logic gate to the reference ground end and release a latch state of the hot plug control signal.

10. The main board according to claim 6, wherein the latch receives the operation power through a battery or an external power.

11. A hot plug control signal generator, comprising:
    a controller, providing a control signal; and
    a latch, coupled to the controller, wherein the latch is operated based on an operation power to generate a hot plug control signal, wherein the latch sets the hot plug control signal to a disabled first logic value according to the control signal, and latches the hot plug control signal at the first logic value, wherein the latch comprises:

a reset-set flip-flop, receiving the control signal and the operation power, and generating a latch signal according to the control signal based on the operation power; and a pull-down switch, deciding whether to pull down the hot plug control signal according to the latch signal, wherein the reset-set flip-flop comprises:
- a first NAND gate;
- a second NAND gate, coupled to the first NAND gate to form a reset-set latch circuit, wherein a set end of the reset-set latch circuit receives a reverse signal of the control signal, and a reset end of the reset-set latch circuit is coupled to a reference ground end through an inverter;
- a third NAND gate, having a first input end coupled to an output end of the reset-set latch circuit, wherein a second input end of the third NAND gate receives a second logic value;
- a NOR gate, having a first input end coupled to the output end of the reset-set latch circuit, wherein a second input end of the NOR gate receives the first logic value; and
- a first transistor and a second transistor, coupled in series between the operation power and the reference ground end, wherein control ends of the first transistor and the second transistor are respectively coupled to output ends of the third NAND gate and the NOR gate, and the first transistor and the second transistor are configured to generate the latch signal.

12. The hot plug control signal generator according to claim 11, wherein after the operation power is restarted, a latch state of the hot plug control signal is released.

13. A main board, comprising:

a hot swap controller, receiving a hot plug control signal; and a hot plug control signal generator, coupled to the hot swap controller, the hot plug control signal generator comprising:

a controller, providing a control signal; and a latch, coupled to the controller, wherein the latch is operated based on an operation power to generate the hot plug control signal, wherein the latch sets the hot plug control signal to a disabled first logic value according to the control signal, and latches the hot plug control signal at the first logic value, wherein the latch comprises:

a reset-set flip-flop, receiving the control signal and the operation power, and generating a latch signal according to the control signal based on the operation power; and a pull-down switch, deciding whether to pull down the hot plug control signal according to the latch signal, wherein the reset-set flip-flop comprises:
- a first NAND gate;
- a second NAND gate, coupled to the first NAND gate to form a reset-set latch circuit, wherein a set end of the reset-set latch circuit receives a reverse signal of the control signal, and a reset end of the reset-set latch circuit is coupled to a reference ground end through an inverter;
- a third NAND gate, having a first input end coupled to an output end of the reset-set latch circuit, wherein a second input end of the third NAND gate receives a first logic value;
- a NOR gate, having a first input end coupled to the output end of the reset-set latch circuit, wherein a second input end of the NOR gate receives the first logic value; and
- a first transistor and a second transistor, coupled in series between the operation power and the reference ground end, wherein control ends of the first transistor and the second transistor are respectively coupled to output ends of the third NAND gate and the NOR gate, and the first transistor and the second transistor are configured to generate the latch signal.

14. The main board according to claim 13, wherein after the operation power is restarted, a latch state of the hot plug control signal is released.

* * * * *